United States Patent [19]
Zeiger et al.

[11] Patent Number: 4,698,594
[45] Date of Patent: Oct. 6, 1987

[54] METHOD FOR RECORDING NUCLEAR RESONANCE SIGNALS

[75] Inventors: Heinz Zeiger, Waldbronn; Günther R. Laukien, Rheinstetten, both of Fed. Rep. of Germany

[73] Assignee: Bruker Medizintechnik GmbH, Rheinstetten-Forchheim, Fed. Rep. of Germany

[21] Appl. No.: 863,127

[22] Filed: May 14, 1986

[30] Foreign Application Priority Data

May 17, 1985 [DE] Fed. Rep. of Germany ....... 3517812

[51] Int. Cl.$^4$ ............................................. G01R 33/20
[52] U.S. Cl. .................................... 324/309; 324/318
[58] Field of Search ............... 324/300, 307, 309, 316, 324/318; 128/653

[56] References Cited

U.S. PATENT DOCUMENTS

| | | | |
|---|---|---|---|
| 4,528,509 | 7/1985 | Radda et al. | 324/309 |
| 4,636,730 | 1/1987 | Bottomley | 324/318 |

FOREIGN PATENT DOCUMENTS

448406 11/1974 U.S.S.R. .............................. 324/318

*Primary Examiner*—Stewart J. Levy
*Assistant Examiner*—Kevin D. O'Shea
*Attorney, Agent, or Firm*—Kokjer, Kircher, Bradley, Wharton, Bowman & Johnson

[57] ABSTRACT

In order to record nuclear magnetic resonance signals in an area of interest of a sample body which is exposed to a constant magnetic field, a measuring head is applied to a surface of the sample body adjacent the area of interest. The measuring head includes an RF transreceiver unit having a helical line disposed within a shield being open at one of its radial end planes. The helical line is free from connections on one end, and the other end is arranged as an uppermost winding which is electrically connected to the shield via a connection arranged in the open radial end plane. The amplitude of an RF current supplied to a transmitter coil which is arranged coaxially to said measuring head is adjusted to generate an image plane of predetermined constant magnetic RF field strength B at a defined distance above the open radial end plane. The RF current is gated to induce pulsed nuclear magnetic resonance transitions for a predetermined kind of nuclei with respect to the strength of the constant magnetic field. In order to increase the information content of the signals obtained, an image is generated of the two-dimensional distribution of the induced nuclear magnetic transitions within the generated image plans.

10 Claims, 8 Drawing Figures

METHOD FOR RECORDING NUCLEAR RESONANCE SIGNALS

The present invention relates to a method for recording nuclear magnetic resonance signals in defined areas of a sample body comprising the steps of:

exposing said area to a constant magnetic field $B_O$ generated along a first axis;

applying in a direction perpendicular to said first axis a measuring head on a surface of said sample body adjacent said area, said measuring head comprising an RF transceiver unit having a helical line with two ends and further having a shielding being arranged coaxially to said helical line and open at a radial end plane thereof, said helical line being free from connections on one of the said ends, the other of the said ends being arranged as an uppermost winding of said helical line, said winding being electrically connected to said shielding via a connection arranged in said radial end plane, wherein said measuring head is applied on said surface in said radial end plane;

varying the amplitude of an RF current supplied to a transmitter coil arranged coaxially to said measuring head to generate image planes of predetermined constant magnetic RF field strength B at a defined distance d above said radial end plane;

gating said RF current to induce pulsed nuclear magnetic resonance transitions for a predetermined kind of nuclei with respect to the strength of the constant magnetic field.

A method and apparatus of this type is described in applicant's co-pending U.S. Application Ser. No. 670,642, now U.S. Pat. No. 4,687,226, issued on Aug. 19, 1986, the disclosure of which is incorporated herein by reference.

Now, it is the object of the present invention to improve a method and an apparatus according to the above identified patent in a manner to increase the information content of the measuring results obtained and, thus, to facilitate the measurements and reduce the time required for carrying out the same.

According to the method of the present invention, this object is achieved by generating an image of the two-dimensional distribution of said induced nuclear magnetic transitions within one of the said image planes.

Hence, the invention offers the advantage, in addition to those provided already by the above referenced patent, that it is possible not only to select defined areas in the sample body, but also to form immediately an image thereof so that the measuring results can be evaluated immediately. This permits in turn to take immediate decisions regarding subsequent measurements or the further processing of the measuring results.

When applying the method and/or the apparatus of the invention for example on human or animal bodies, a considerable volume of the body can be "swept" by varying the distance between the selected area and the plane of application, and the images obtained would provide an immediate indication of any suspicious area, for example a tumor, existing in the covered volume.

Contrary to usual total-body tomographs, this rapid examination method requires no large transmitter and receiver coils, but can be carried out by applying upon the body a relatively small measuring head, without the risk of any interfering radiation penetrating to the outside or from the outside into the measuring head itself.

According to a preferred embodiment of the invention, at least two of the image planes fulfill the 90° and/or 270° and/or 450° condition of pulsed nuclear magnetic resonance.

This measure provides the advantage that several surfaces or flat areas of the sample body, arranged at defined distances from each other, can be excited simultaneously so that, provided the display means are designed in a suitable manner, the superimposed images of several such planes can be viewed simultaneously. This reduces the effective measuring time still further because a single measurement provides already a more or less coarse mosaic view of the whole interesting volume of the sample body.

According to a preferred further improvement of the invention, one of the said image planes can be selected by superimposing, and adjusting in a known manner, a gradient of the constant magnetic field active in the axis.

This measure provides the advantage that by selecting a single interesting area, the amount of computer time required for the representation of the image can be reduced. Hence, it is possible in this manner to obtain a general overview by exciting simultaneously several superimposed planes in accordance with the variant described before - which requires, however, a certain amount of computer time for the formation of the images of the several planes - and to concentrate thereafter on one of the said planes by adjusting the gradient in a suitable manner, because when the gradient is applied, the resonance conditions are thereafter fulfilled only for the one selected plane. The display menas then also has to form the image of the said one area only.

According to further variants of the invention, the image may either indicate the spin density or the chemical displacement of each image point, in the manner known in the art.

According to a further, particularly preferred embodiment of the invention, a high-resolution nuclear resonance measurement is carried out, following the generating of the image, in the area of the sample body selected by the image plane, or in part of the said plane.

This measure is of particular advantage in cases where an image created of a plane provided initially an overview of the area of the sample body and it was found that there is a suspicious area that should be examined more closely. In this case, it is now possible, by conventional means, to carry out a high-resolution nuclear resonance measurement either of the whole area or the interesting part thereof, and to derive from the recorded spectrum conclusions as to the chemical composition of the investigated area of the sample body.

It will be easily seen that on the whole a very rapid diagnosis is possible in this manner because initially a coarse mosaic view of the whole volume of the sample body can be obtained by simultaneous representation of several spaced planes, whereafter one of the said planes can be selected and viewed - if necessary with the aid of an image of higher resolution-, and finally a selected closely defined area can be subjected to a high-resolution nuclear resonance measurement. In this manner, it is possible to identify and analyze chemically a measuring point by as little as three steps.

According to further variants of the invention, one may use as a transmitter coil either the helical line of the measuring head itself or else a separate transmitter coil arranged coaxially to the measuring head and consisting of a Helmholtz coil or of a helical line of an additional measuring head.

It goes without saying, that the measurements may, in a manner known as such, be carried out either with simultaneous decoupling of the same or another nuclear species.

Other advantages of the invention will become apparent from the following specification and the attached drawing.

Hereafter, certain embodiments of the invention will be described in detail with reference to the drawing in which.

Figure 1:
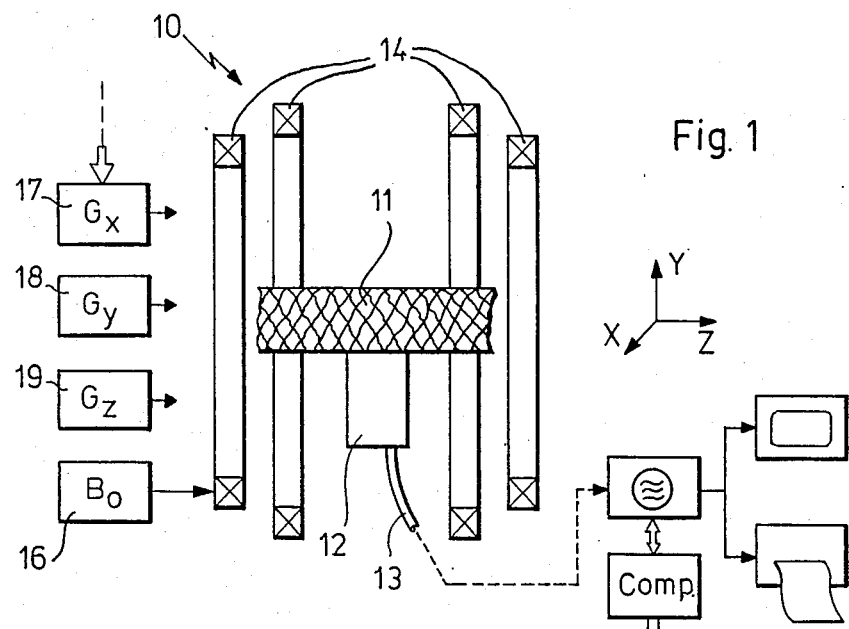
FIG. 1 is a diagrammatic three-dimensional representation of a spectrometer arrangement suited for carrying out the method of the invention and/or using the apparatus of the invention.

In FIG. 1, a magnet system arranged in a space defined by the space coordinates s, y, z is generally designated by reference numeral 10. The space coordinate z coincides with the axis of the magnet system 10. Extending along the axis z, there can be seen a sample 11 in a diagrammatic representation which sample may for example consist of the body or part of the body of a patient, for example an arm or a leg. It goes, however, without saying that the measuring head according to the invention can be used also for anorganic samples and for individual samples of live or non-living tissues.

A supply line 13 leads from the measuring head 12 to transmitter/receiver and display means 15 of the type known in the art. The display means 15 serves for controlling the magnetic and RF fields acting on the sample 11 and permits in a manner known as such to select two-dimensional or point-shaped areas within the sample 11 and to excite isolated nuclear resonance in these selected areas. The display means 15 further permits, in the manner known as such, to form an image of the selected areas from the recorded nuclear resonance signals obtained either from pulsed RF signals, continuously radiated RF signals or else by means of Fourier transformation, for example by correlating the spin density or chemical displacement of the respective measuring points with the individual image points.

In addition, however, the display means 15 is also in a position to perform high-resolution nuclear spin measurements in the selected areas, which are then displayed or output as spectra.

The magnet system 10 is indicated only schematically. It consists of a so-called double Helmholtz arrangement comprising two pairs of Helmholtz coils 14. The Helmholtz coils 14 generate in the interior a constant magnetic field of high homogeneity in all three space coordinates x, y, z.

The Helmholtz coils 14 are supplied from a power pack 16. Additionally, there are provided gradient power supply units 17, 18, 19 for supplying gradient coils not shown in FIG. 1, which serve to select individual areas in the interior of the sample 11 in the manner described above. The power packs 16 to 19 may be computer-controlled, or can be adjusted via the display means 15.

Figure 2:
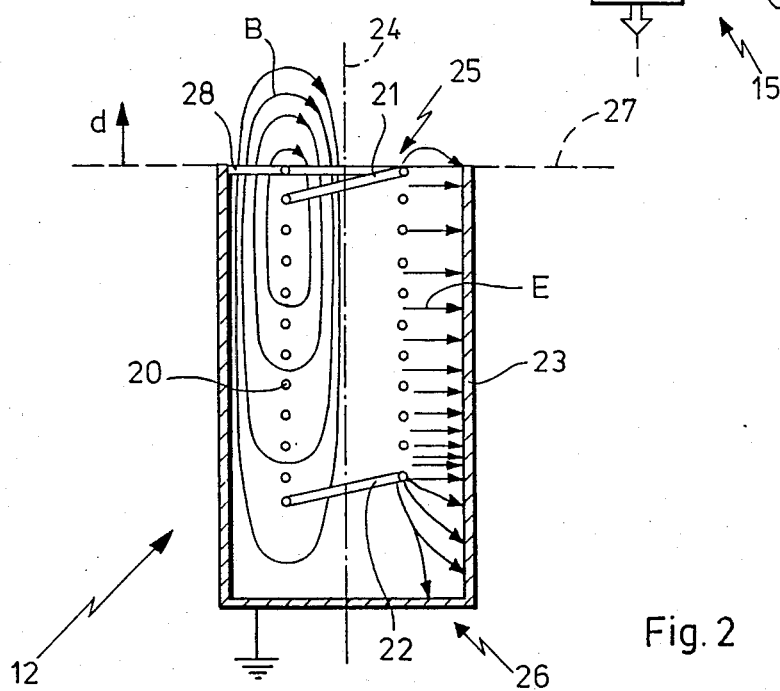
FIG. 2 shows a schematic cross-sectional representation of a measuring head according to the invention illustrating the field distribution obtained.

FIG. 2 shows the field distribution in a measuring head 12 according to the invention. The measuring head 12 consists substantially of a helical line 20 of the type usually called "helix" in technical literature. For better clarity, only the uppermost winding 21 of the helical line 20 and the lowermost winding 22 are shown completely in FIG. 2. The second essential element of the measuring head 12 of the invention consists in an earthed shielding 23 which in one embodiment extends for example coaxially around the helical line 20. The shielding 23 as it extends along its longitudinal axis 24 comprises an upper open end 25 and a lower closed end 26. In the embodiment shown in FIG. 2, the helical line 20 extends along the axis 24 in such a manner that the upper winding 21 which is connected with the shielding 23 through a connection 28 is located approximately in the plane of the upper open end 25 where it forms a application plane 27, i.e. the plane by which the measuring head 12 is applied on the sample 11 under examination. The end of the helical line 20 opposite the upper open end 25 is, however, void of any connections.

From the electrical point of view this means that the upper end 25 of the helical line 20 is connected with the shielding 23 and, thus, to earth via the connection 28, whereas in the area of its lowermost winding 22 it is electrically open at a distance from the lower closed end 26 of the shielding 23.

Thus, the field distribution as shown in FIG. 2 is obtained, where the half to the left of the axis 24 showing the magnetic flux lines is designated generally by the letter B, while the half to the right of the axis 24 showing the electric flux lines is designated generally by the letter E. It can be seen that the magnetic flux lines B close in a radial plane of the helical line 20 and extend outwardly, in particular above the open end 25. Now, when the measuring head 12 is placed on the sample 11 by its application plane 11, the distribution of the magnetic flux lines B obtained is such that the intensity of the magnetic field decreases towards the center of the sample 11, along a coordinate d in FIG. 2.

On the other hand, the electric flux lines E are found substantially in the space between the helical line 20 and the shielding 23 so that they practically do not make themselves felt externally. There are hardly any leakage fields of the electric flux lines E encountered in the area above the application plane 27. In addition, the E flux line density decreases from the bottom to the top.

Figure 3:
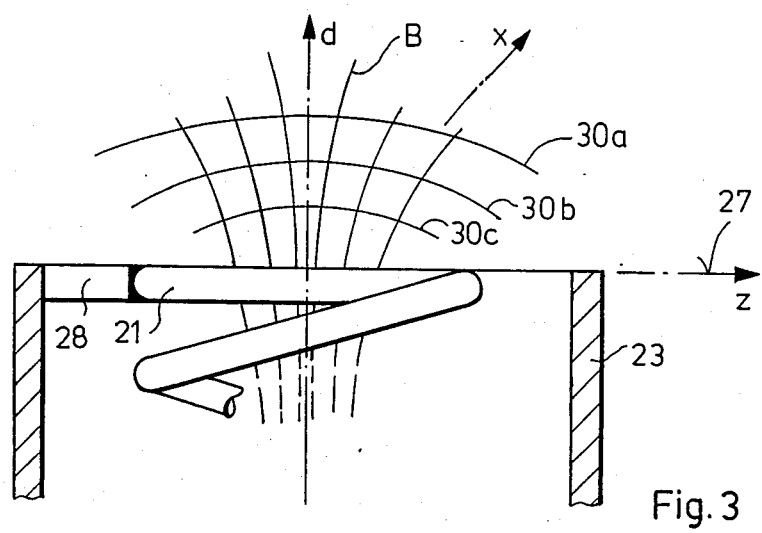
FIG. 3 shows an enlarged representation of a detail of FIG. 2.

FIG. 3 shows - in enlarged scale - the point where the magnetic field lines B emerge from the application plane 27. As is known, the planes of identical magnetic field lines are defined by an identical spacing of the field lines B so that these planes can be represented in FIG. 3 as surface areas 30a, 30b, 30c which are slightly curved for practical reasons. In the representation of FIG. 3, the distances between the planes 30a, 30b, 30c have been selected at random, and the field strength increases from the plane 30a towards the planes 30b and 30c.

If under these conditions nuclear resonance measurements were carried out using a continuously radiated RF field, the resonance condition would have to be met in the entire space above the application plane 27, due to the RF/strength relationship of the constant magnetic field determined by the gyromagnetic relation, regardless of the RF field strength prevailing at the time. If, in contrast, a pulsed RF signal is used for exciting the nuclear resonance, the so-called 90° and/or 270° and/or 450° condition will be met only in certain specific planes because the RF field strength will be sufficiently high only in these very planes to cause the spins of a particular nuclear species to rotate by exactly 90° or 270°... If the parameters are properly set, one therefore obtains in the representation of FIG. 3 a situation in which the before-mentioned conditions are met only in the planes 30a, 30b, 30c. Considering that the RF field strength - as mentioned before - increases towards the application plane 27, the 90° condition is fulfilled, for example, by the plane 30a, the 270° condition by the plane 30b and the 450° condition by the plane 30c.

Figure 4:
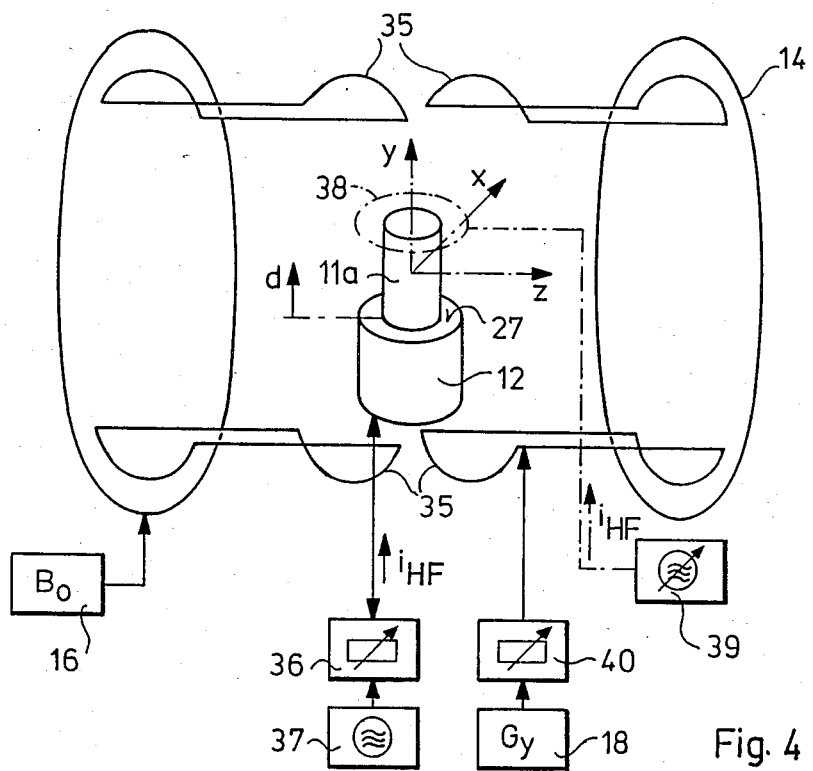
FIG. 4 shows a diagrammatic representation of a variant of a spectrometer arrangement with variably adjustable field gradients.

FIG. 4 shows an apparatus for carrying out one embodiment of the method of the invention.

In FIG. 4, reference numeral 35 designates gradient saddle coils producing a gradient of the constant magnetic field in the y direction. Accordingly, a field is superimposed upon the constant magnetic field extending in the z direction, whereby the field strength in the z direction varies in intensity as one passes through the interior of the coils 14 in the y direction.

The measuring head 12 is supplied with an RF supply current $i_{RF}$ from an RF transmitter/receiver 37, via an amplitude control unit 36. The two arrows in the supply line between the amplitude control unit 36 and the measuring head 12 indicate that transmitting and receiving is possible in this manner without the need to provide additional RF means.

The gradient saddle coils 35 are fed from the gradient power supply unit 18 via an amplitude control unit 40 acting as a current control.

In a variant of the embodiment shown in FIG. 4, there may be provided an additional transmitter coil 38 arranged coaxially to the measuring head 12 and supplied by a separate RF transmitter 39. In this case, an RF magnetic field is applied via the separate transmitter coil 38 upon a sample 11a positioned on the application plane 27 of the measuring head 12, and the measuring head 12 serves merely as an antenna in the receiving mode of the transmitter/receiver 37. The transmitter coil 38 may be a Helmholtz coil, but may also take the form of a helical line of a second measuring head whose structure corresponds to that of the measuring head 12.

As appears easily from FIG. 4, the position of the planes 30a to 30c illustrated in FIG. 3 can be varied by adjusting the amplitude control unit 36 for the RF supply current $i_{RF}$. In addition it is possible, by adjusting the amplitude control unit 40 for the supply current of the gradient saddle coils 35, to adjust a field profile wherein the strength of the constant magnetic fields varies in the y direction. Hence, it is possible to pre-set within the sample 11a, at a pre-determined distance d from the plane of application 27, the variation of intensity of the constant magnetic field and also the position of the planes 30a to 30c where the before-mentioned pulse requirements are fulfilled.

Figure 5:
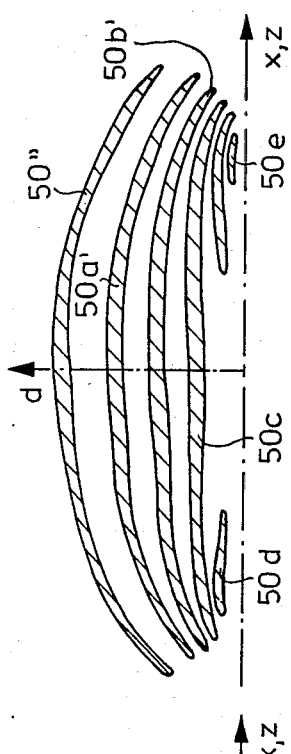
FIGS. 5 to 7 show images of measuring results of the type obtainable with the aid of the method and/or the apparatus according to the invention by varying the applied RF current.
Figure 6:
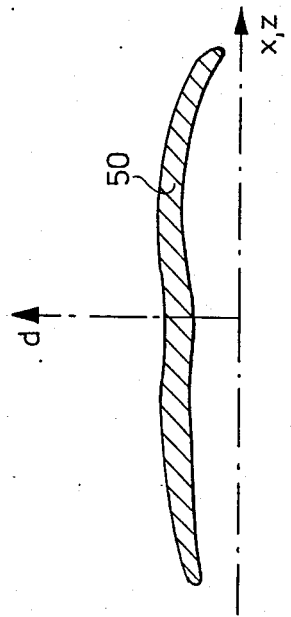
Figure 7:
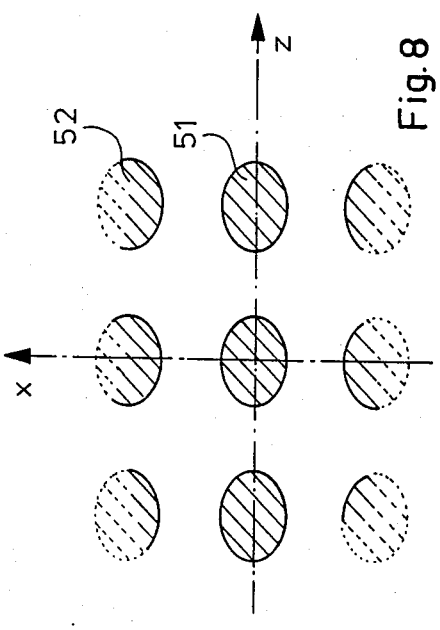

FIGS. 5 to 7 illustrate measuring results obtained in practice with the aid of the device shown in FIG. 4.

For carrying out these practical tests, a cylindrical glass filled with water was positioned on the application plane 27 of the measuring head 12, as indicated in FIG. 4 by the cylindrical sample body 11a.

At the same time, the display means 15 (cf. FIG. 1) was adjusted in such a manner that an image was generated in a plane parallel to the axis 24 of the measuring head 12, i.e. in an yx and/or yz direction. In the representations shown in FIGS. 5 to 7, the parameter d is shown in the y direction in order to illustrate the distance from the application plane 27.

FIG. 5 shows a signal 50 obtained by a relatively weak RF radiation, which means that in the experiment illustrated in FIG. 5, a relatively low RF supply current $i_{RF}$ was set by the amplitude control unit 36. In this case, only a single plane was obtained above the application plane 27 where the 90° condition was fulfilled. The signal 50, therefore, represents an axial section through a "disk" of the water contained in the cylindrical glass.

Now, when the RF supply current $i_{RF}$ is increased by varying the amplitude control unit 36, the signal 50 moves towards higher d values. This can be seen, for example, in FIG. 6 where the signal 50 now occupies the position 50'. One further recognizes in FIG. 6 a second resonance plane represented by a signal 50a corresponding to a disk of the cylindrical water sample wherein the 180° condition is just fulfilled. Further, one sees in FIG. 6 the outlines of another signal 50b corresponding to a cross-sectional plane where the 270° condition is fulfilled.

FIG. 7 shows another phase of the test where the RF supply current $i_{RF}$ has been set to even higher values, and now a total of six cross-sectional planes 50″, 50a′, 50b′, 50c, 50d, 50e can be seen all of which fulfill the $90° + n180°$ condition.

Now, if only one of these planes 50″ to 50e is to be examined and to be represented in the form of an image in a plane perpendicular to FIGS. 5 to 7, then one of these planes can be selected by superimposing the Gy field gradient in the manner described in connection with FIG. 4 so that the resonance condition is fulfilled only in a single one of the planes 50″ to 50e.

Figure 8:
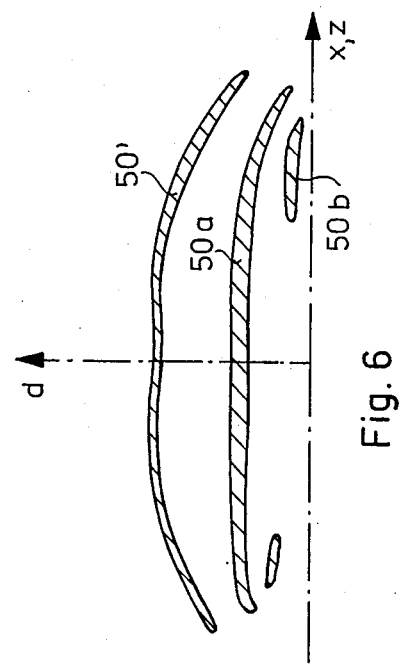
FIG. 8 shows an image in a plane perpendicular to the representation of FIGS. 5 to 7, but for a different sample.

FIG. 8 shows the result of a corresponding experiment. In this case, however, nine water-filled test tubes, instead of a single one, were placed upon the application plane 27 of the measuring head 12 in a direction parallel to the y axis. Then the RF supply current $i_{RF}$ was initially set in the manner represented in FIGS. 6 or 7, whereafter one of the represented planes was "selected" by superimposing a Gy field gradient which fulfilled the resonance condition only in one of these planes. All the other planes were "blanked out" in this manner so that signal and image processing by the means 15 was rendered particularly simple and quick.

One recognizes in FIG. 8 the cross-sections of the nine test tubes in the form of signals 51 and 52. It can be noted that the outer marginal areas of the signals 52 become indistinct. This does not surprise because judging from FIG. 3 it had to be expected that the signal planes 50 according to FIGS. 5 to 7 would be curved in the d direction. Since on the other hand a linear y field gradient Gy was superimposed in the experiment shown in FIG. 4, this means that the resonance condition was fulfilled less and less in the marginal areas of the signal planes 50 so that the signals necessarily become indistinct in these areas. If a completely linear image covering the full area is desired, one therefore has either to utilize the linear center area of the signal planes 50 or else to enlarge the measuring head 12 correspondingly.

We claim:

1. A method for recording nuclear magnetic resonance signals in defined areas of a sample body comprising the steps of:

exposing said area to a constant magnetic field $B_O$ generated along a first axis;

applying in a direction perpendicular to said first axis a measuring head on a surface of said sample body adjacent said area, said measuring head comprising an RF transceiver unit having a helical line with two ends and further having a shielding being arranged coaxially to said helical line and open at a radial end plane thereof, said helical line being free from connections on one of the said ends, the other of the said ends being arranged as an uppermost winding of said helical line, said winding being electrically connected to said shielding via a connection arranged in said radial end plane, wherein said measuring head is applied on said surface in said radial end plane;

varying the amplitude of an RF current supplied to a transmitter coil arranged coaxially to said measuring head to generate image planes of predetermined constant magnetic RF field strength B at a defined distance d above said radial end plane;

gating said RF current to induce pulsed nuclear magentic resonance transitions for a predetermined kind of nuclei with respect to the strength of the constant magnetic field $B_0$;

generating an image of the two-dimensional distribution of said induced nuclear magnetic transitions within one of the said image planes.

2. A method according to claim 1, wherein at least two of the said image planes fulfill the 90° and/or 270° and/or 450° condition of the pulsed nuclear magnetic resonance.

3. A method according to claim 2, wherein one of the said image planes is selected by superimposing and adjusting in a known manner a gradient $G_y$ of the constant magnetic field $B_O$ along said first axis y.

4. A method according to claim 1, wherein the image representation shows the spin density of each image point.

5. A method according to claim 1, wherein the image representation shows the chemical shift of each image point.

6. A method according to claim 1, wherein following the generating of said image a high-resolution nuclear magnetic resonance measurement is carried out in the said area of said sample body defined by said selected image plane or part thereof.

7. A method according to claim 1, wherein said helical line is used as transmitter coil.

8. A method according to claim 1, wherein a transmitter coil separate from the measuring head is used.

9. A method according to claim 8, wherein the said separate transmitter coil is a Helmholtz coil arranged coaxially to said measuring head.

10. Method according to claim 8, wherein the separate transmitter coil is a helical line of an additional measuring head.

* * * * *